US005138270A

United States Patent [19]

Nakata et al.

[11] Patent Number: 5,138,270

[45] Date of Patent: Aug. 11, 1992

[54] HIGH VOLTAGE PULSE GENERATOR

[76] Inventors: Shuhei Nakata; Chihiro Tsukishima, both c/o Chuo Kenkyusho of Mitsubishi Denki Kabushiki Kaisha, 1-1, Tsukaguchi Hon-machi 8-chome, Amagasaki City, Hyogo Prefecture, Japan

[21] Appl. No.: 440,250

[22] Filed: Nov. 22, 1989

[30] Foreign Application Priority Data

| | | | |
|---|---|---|---|
| Nov. 24, 1988 | [JP] | Japan | 63-294663 |
| Dec. 22, 1988 | [JP] | Japan | 63-322125 |
| Feb. 13, 1989 | [JP] | Japan | 1-31151 |
| Mar. 17, 1989 | [JP] | Japan | 1-65660 |

[51] Int. Cl.[5] .......................... H03K 3/53; H03K 3/55; H03K 3/86

[52] U.S. Cl. ....................................... 328/67; 307/106; 328/65

[58] Field of Search ........................ 328/60, 61, 65, 67; 307/106

[56] References Cited

U.S. PATENT DOCUMENTS

| | | | |
|---|---|---|---|
| 2,837,638 | 6/1958 | Frink | 328/67 |
| 3,432,664 | 3/1969 | Robison | 328/67 |
| 4,482,816 | 11/1984 | Richardson et al. | 328/65 |

OTHER PUBLICATIONS

Tell-Teras Activity Report, 1980-1986, Lina and Storage Ring Facilities Electrotechnical Laboratory.

Experiment of Fast-Electron Extraction System, S. Nakata, 1987, Mitsubishi Electric Corp., Japan.

Design of Injector Synchrotron, Institute for Molecular Science Myodaiji, Okasaki, Mar. 1981.

"Design of Injector Synchrotron" UVSOR-7; Mar., 1981.

"Design of UVSOR Storage Ring" UVSOR-9; Dec. 1982.

*Primary Examiner*—John Zazworsky

[57] ABSTRACT

A high voltage pulse generator circuit is connected to a pulse electromagnet and a Blumlein charge circuit comprising a pair of coaxial cables or charge lines connected in parallel and each having an impedance of Z/2 is connected in series to a transmission line having an impedance Z. A power source is connected to the charge circuit via a switching device and a charging resistor, thereby enabling a reduction in the charging voltage.

3 Claims, 2 Drawing Sheets

HIGH VOLTAGE PULSE GENERATOR

BACKGROUND OF THE INVENTION

1. Field of the Invention

This invention relates generally to an apparatus for generating pulses and, more particularly, to a high voltage pulse generator circuit capable of generating pulses of a reduced rise time.

2. Description of the Related Art

FIG. 1 shows a circuit diagram of a conventional high voltage pulse generator described in the thesis "Experiment of Fast Electron Extraction System" written by S. Nakata and made public in IEEE Proceedings of Particle Accelerator Conference. A DC power source represented by H.V. is connected by a charging resistor 22 to one end of a pulse forming network (PFN) type charge circuit 21 having an impedance Z. The other end of the charge circuit 21 is connected to a transmission line 24 via a switching device 23, e.g., a thyratron. The transmission line 24 has an impedance Z and is constituted by, for example, a coaxial cable. A matching resistor 25 having a resistance $R_M$ and a load, e.g., a pulse coil 26 of a kicker magnet (not shown) are connected in series between the inner and outer conductors of the transmission line at the load end thereof. $C_f$ in parallel with the matching resistor 25 represents a stray capacitance, and $C_o$ in series therewith represents a series capacitance. The pulse coil 26 having an inductance $L_k$ creates a stray inductance $L_f$ in series.

Before the thus-constructed high voltage pulse generator is started, the switching device 23 is maintained in the off state. Accordingly, the PFN charge circuit 21 is charged at a voltage V by the DC power source H.V. When the switching device 23 is switched on, the electric charge accumulated in the PFN charge circuit 21 is supplied to the matching resistor 25 and to the pulse coil 26 via the switching device 23 and the inner conductor of the transmission line 24, and returns to the switching device 23 via the outer conductor. The electric charge is released to ground (not shown) at the switching device 23.

At this time, if the time taken for pulse transmission through the PFN charge circuit 21 is T, pulses of a pulse width of 2T are supplied to the transmission line 24 at a voltage of V/2, provided that the PFN charge circuit 21 and the transmission line have equal impedances, i.e., Z as shown in FIG. 5.

The rise of the current flowing through the pulse coil 26 is expressed by the following equation:

$$I = I_o\left(1 - e^{\frac{-(L_f + L_k)}{R_M}t}\right)$$

where $I_o$ is a stationary state value of the current I and is expressed by $$I_o = \frac{1}{2}\cdot\frac{V}{R_M}$$

To reduce the current I rise time, it is necessary to increase the resistance $R_M$ of the matching resistor 25 or to reduce the size of the pulse coil 26 so as to reduce $(L_f+L_k)$ in the above equation. Since $(L_f+L_k)$ and $I_o$ are generally determined by the required size of the pulse coil 26 and the required intensity of the produced magnetic field, the circuit is ordinarily designed to set a larger value of $R_M$. Consequently, to reduce the current I rise time, it is necessary to increase the charging voltage since the voltage V of the DC power source H.V. is equal to $2R_M \cdot I_o$. The design for increasing the charging voltage to obtain pulses of a shorter rise time results in an increase in the manufacture cost of the circuit and is also disadvantageous in terms of electrical insulation.

SUMMARY OF THE INVENTION

An object of the present invention is to solve this problem by using a high voltage pulse generator in which the charging voltage can be set to a lower level.

In accordance with the present invention, at least one Blumlein type charge circuit having a pair of coaxial cables connected in parallel and each having an impedance of Z/2 is used instead of a PFN charge circuit having an impedance Z. Pulses having a voltage V equal to the DC power supply voltage or a voltage of 2 V are thereby supplied to the pulse coil. That is, the charging voltage can be reduced to ½ or ¼ of that in the case of the conventional generator.

DESCRIPTION OF THE PREFERRED EMBODIMENTS

The present invention relates to a power supply circuit for pulse electromagnets or, more specifically, for the high speed pulse electromagnet, i.e., a high voltage pulse generator circuit capable of generating pulses of a short rise time while being supplied with a low charging voltage.

Figure 1:
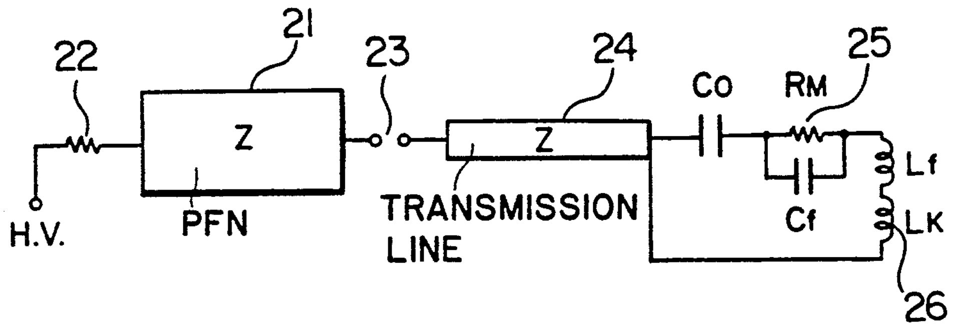
FIG. 1 PRIOR ART
FIG. 1 is a circuit diagram of a conventional high voltage pulse generator.
Figure 2:
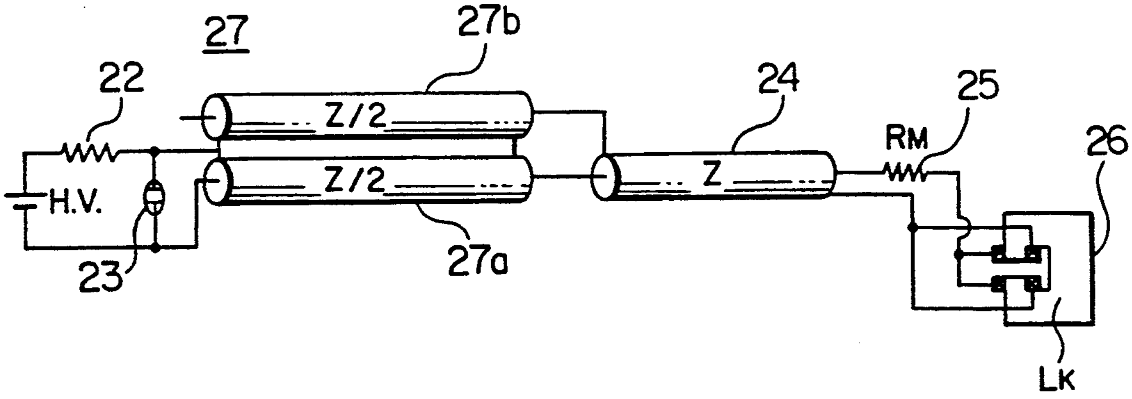
FIGS. 2 to 4 are circuit diagrams of first to third embodiments of a high voltage pulse generator provided by the present invention.

FIG. 2 shows a circuit of a first embodiment of the high pressure voltage generator provided by the present invention. Components 22 to 26 are equivalent to those shown in FIG. 1. In accordance with the present invention, a Blumlein type charge circuit 27 is provided which consists of, for example, a pair of coaxial cables *27a* and *27b* connected in parallel and each having an impedance of Z/2. At the power supply end of the Blumlein charge circuit 27, the inner conductor of the coaxial cable *27a* is connected to a minus terminal of the DC power source H.V., and a point of connection between the outer conductors of the coaxial cables *27a* and *27b* is connected to the plus terminal of the DC power source H.V. via the charging resistor 22. The switching device 23 is connected between the minus terminal and the outer terminal connection point. At the load end of the Blumlein charge circuit 27, the inner conductor of the coaxial cable *27a* is connected to the inner conductor of the transmission line 24 while the inner conductor of the coaxial cable *27b* is connected to the outer conductor of the transmission line 24.

In the first embodiment thus-constructed, the switching device 23 is first maintained in the off state, and the Blumlein charge circuit 27 is charged at a voltage V by the DC power source H.V. When the switching device 23 is switched on, the electric charge accumulated in the Blumlein charge circuit 27 is supplied as pulses at the voltage V to the pulse coil 26 via the transmission line 24 and the matching resistor 25.

Figure 3:
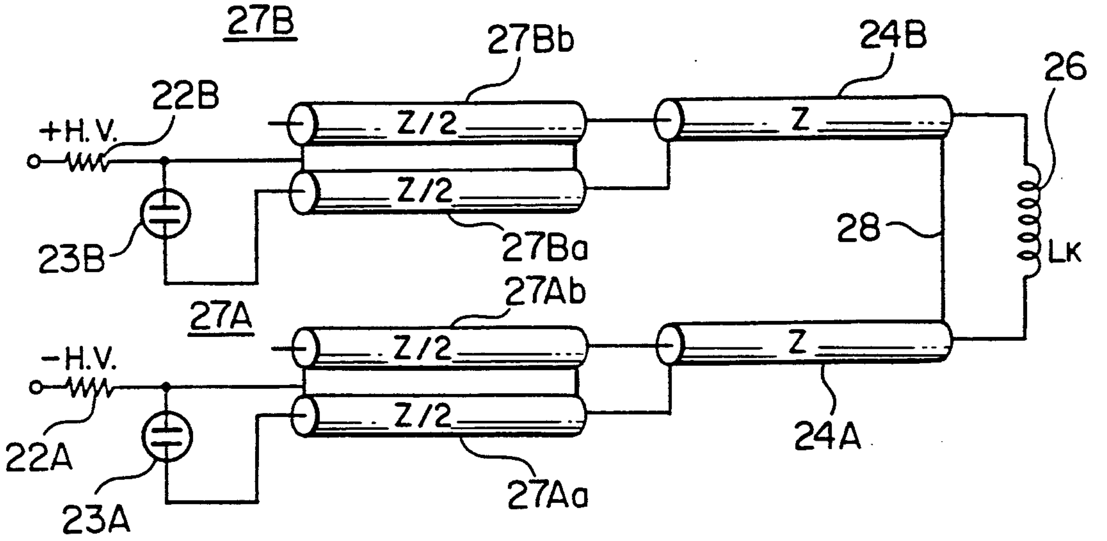

FIG. 3 shows a circuit of a second embodiment of the high voltage pulse generator of the present invention which includes a pair of DC power sources +H.V. and −H.V., a pair of charging resistors 22A and 22B, a pair of switching devices 23A and 23B, a pair of Blumlein charge circuits 27A and 27B and a pair of transmission lines 24A and 24B while eliminating the need for the matching resistor 25. The Blumlein charge circuit 27A consists of a pair of coaxial cables 27A*a* and 27A*b* connected in parallel and each having an impedance of Z/2. At the power supply end of the Blumlein charge circuit 27A, the inner conductor of the coaxial cable 27A*a* is connected to the DC power source −H.V. via the switching device 23A and the charging resistor 22A, and a point of connection between the outer conductors of the coaxial cables 27A*a* and 27A*b* is connected to the DC power source −H.V. via the charging resistor 22A. At the load end of the Blumlein charge circuit 27A, the inner conductor of the coaxial cable 27A*a* is connected to the outer conductor of the transmission line 24A while the inner conductor of the coaxial cable 27A*b* is connected to the inner conductor of the transmission line 24A. The DC power source +H.V., the charging resistor 22B, the switching device 23B, the Blumlein charge circuit 27B and the transmission line 24B are connected in the same manner. At the load end of the transmission lines 24A and 24B, the pulse coil 26 is connected between the inner conductors while the outer conductors are connected to each other by a conductor 28.

In the second embodiment device thus-constructed, the switching device 23A is first maintained in the off state, and the Blumlein charge circuit 27A is charged at a voltage −V by the DC power source −H.V. At the same time, the switching device 23B is first maintained in the off state, and the Blumlein charge circuit 27B is charged at a voltage +V by the DC power source +H.V. When the switching devices 23A and 23B are switched on, the electric charge accumulated in the Blumlein charge circuits 27A and 27B is supplied as pulses at a voltage of $V-(-V)=2$ V to the pulse coil 26 via the transmission line 24A and 24B. This effect means that the charging voltage can be reduced to $\frac{1}{4}$ of that in the case of the conventional generator. In the second example, the impedances of the transmission lines 24A and 24B on the side of the load are each Z and satisfy the matching condition, and there is therefore no need for any matching resistor.

Figure 4:
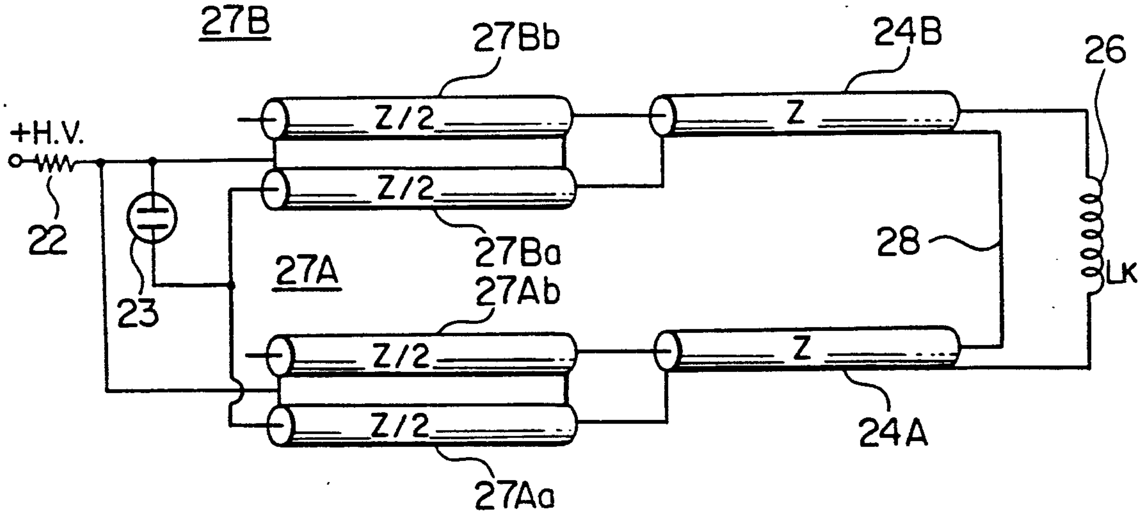

FIG. 4 shows a circuit of a third embodiment of the high voltage pulse generator of the present invention. The components thereof are generally equal to those of the second embodiment except that the third example makes use of only one DC power source and only one switching device. At the power supply end of the Blumlein charge circuits 27A and 27B, the inner conductor of the coaxial cable 27A*a* of the Blumlein charge circuit 27A and the inner conductor of the coaxial cable 27B*a* of the Blumlein charge circuit 27B are connected together and are then connected to the DC power source +H.V. via the switching device 23 and the charging resistor 22. Also, a point of connection between the outer conductors of the coaxial cables 27A*a* and 27A*b* of the Blumlein charge circuit 27A connected in parallel and a point of connection between the outer conductors of the coaxial cables 27B*a* and 27B*b* of the Blumlein charge circuit 27B connected in parallel are connected together and are then connected to the DC power source +H.V. via the charging resistor 22. At the load end of the transmission lines 24A and 24B, the outer conductor of the transmission line 24A and the inner conductor of the transmission line 24B are connected through the pulse coil 26 while the inner conductor of the transmission line 24A and the outer conductor of the transmission line 24B are connected by a conductor 28.

In the third embodiment thus-constructed, the switching device 23 is first maintained in the off state, and both the Blumlein charge circuits 27A and 27B are charged at a voltage +V by the DC power source +H.V. When the switching device 23 is switched on, the electric charge accumulated in the Blumlein charge circuits 27A and 27B is supplied as pulses at a voltage of $V+V=2$ V to the pulse coil 2@ via the transmission line 24A and 24B.

In these embodiments coaxial cables are used for the Blumlein charge circuits, but charge lines each having an impedance of Z/2 may be used instead of the coaxial cables to obtain the same effects.

Thus, in accordance with the present invention, at least one Blumlein charge circuit comprises a pair of coaxial cables or charge lines connected in series and each having an impedance of Z/2, thereby enabling simplification of the construction while ensuring that pulses can be supplied to the pulse coil at a voltage V equal to the DC power supply voltage or a voltage of 2 V and that the charging voltage can be reduced to $\frac{1}{2}$ or $\frac{1}{4}$ of that in the conventional generator.

What is claimed is:

1. A high voltage pulse generator for generating high voltage pulses supplied to a pulse electromagnet of a charged particle accumulator, said pulse generator comprising:
   - a DC power source;
   - a Blumlein charge circuit connected between two terminals of said DC power source and formed of a pair of coaxial cables or charge lines connected in parallel and each having an impedance of Z/2;
   - a switching device connected to said DC power source in parallel between said Blumlein charge circuit and said DC power source;
   - a transmission line connected to said Blumlein charge circuit and having an impedance Z;
   - a matching resistor and a pulse coil connected in series between an inner conductor and an outer conductor of said transmission line; and
   - a charging resistor connected to said DC power source in series.

2. A high voltage pulse generator for generating high voltage pulses supplied to a pulse electromagnet of a charged particle accumulator, said pulse generator comprising:
   - plus and minus DC power sources;
   - a pair of Blumlein charge circuits connected to said plus and minus DC power sources separately from each other, each of said Blumlein charge circuits being formed of a pair of coaxial cables or charge lines connected in parallel and each having an impedance of Z/2;
   - switching devices each connected between one of said Blumlein charge circuits and the corresponding one of said DC power sources;
   - a pair of transmission lines respectively connected to said Blumlein charge circuits and each having an impedance Z;
   - a pulse coil connected between inner conductors of said transmission lines;

a conductor connected between outer conductors of said transmission lines; and charging resistors respectively connected to said DC power sources in series.

3. A high voltage pulse generator for generating high voltage pulses supplied to a pulse electromagnet of a charged particle accumulator, said pulse generator comprising:

a DC power source;

a pair of Blumlein charge circuits connected together to said DC power source, each of said Blumlein charge circuits being formed of a pair of coaxial cables or charge lines connected in parallel and each having an impedance of Z/2;

a switching device connected between said Blumlein charge circuits and said DC power source;

a pair of transmission lines respectively connected to said Blumlein charge circuits and each having an impedance Z;

a pulse coil connected between an outer conductor of one of said transmission lines and an inner conductor of the other of said transmission lines;

a conductor connected between an inner conductor of said one of said transmission lines and an outer conductor of the other of said transmission lines; and a charging resistor connected to said DC power source in series.

* * * * *